United States Patent [19]
Namgung

[11] Patent Number: 6,103,977
[45] Date of Patent: *Aug. 15, 2000

[54] MULTILAYER PRINTED CIRCUIT BOARD WITH CURED AND UNCURED RESIN LAYERS

[75] Inventor: Chung Namgung, Portland, Oreg.

[73] Assignee: Westak of Oregon, Forest Grove, Oreg.

[*] Notice: This patent issued on a continued prosecution application filed under 37 CFR 1.53(d), and is subject to the twenty year patent term provisions of 35 U.S.C. 154(a)(2).

[21] Appl. No.: 08/850,523

[22] Filed: May 2, 1997

Related U.S. Application Data

[63] Continuation of application No. 08/318,414, Oct. 5, 1994, Pat. No. 5,739,476.

[51] Int. Cl.[7] .................................................. H05K 1/03
[52] U.S. Cl. ........................ 174/255; 174/258; 174/259; 174/252
[58] Field of Search .................................. 174/255, 256, 174/259, 258, 252, 263, 264, 265, 266

[56] References Cited

U.S. PATENT DOCUMENTS

| | | | |
|---|---|---|---|
| 3,244,795 | 4/1966 | Latimer | 174/259 |
| 4,087,300 | 5/1978 | Adler | 156/184 |
| 4,388,129 | 6/1983 | Oizumi et al. | 156/73.1 |
| 4,421,827 | 12/1983 | Phillips | 428/418 |
| 4,465,538 | 8/1984 | Schmoock | 156/233 |
| 4,510,008 | 4/1985 | Hoshi et al. | 156/254 |
| 4,803,022 | 2/1989 | Barrell et al. | 264/491 |
| 4,927,477 | 5/1990 | Ellis | 156/182 |
| 5,296,651 | 3/1994 | Gurrie et al. | 174/255 |
| 5,455,393 | 10/1995 | Ohshima et al. | 174/250 |
| 5,562,971 | 10/1996 | Tsuru et al. | 174/255 |

*Primary Examiner*—Kristine Kincaid
*Assistant Examiner*—Kamand Cuneo
*Attorney, Agent, or Firm*—Marger Johnson & McCollom, P.C.

[57] ABSTRACT

A printed circuit board assembly includes a first printed circuit board and a first component. The first printed circuit board includes a first cured unreinforced layer and a first dried, uncured, unreinforced layer. The first component includes a second dried, uncured, unreinforced layer. The first and second dried, uncured unreinforced layers are placed in contact prior to curing. During curing, the dried, uncured, unreinforced layers form a unitary cured layer which binds and supports the PCB assembly without the need for a fiber reinforced resin layer. Elimination of the fiber reinforced layer provides a reduction in the overall thickness of the PCB assembly.

4 Claims, 4 Drawing Sheets

MULTILAYER PRINTED CIRCUIT BOARD WITH CURED AND UNCURED RESIN LAYERS

This is a continuation, of application Ser. No. 08/318,414 filed on Oct. 5,1994 now U.S. Pat. No. 5,739,476.

BACKGROUND OF THE INVENTION

The present invention relates generally to printed circuit boards (PCB), and more particularly to printed circuit boards laminated without fiber reinforced binders.

Current market trends in the electronic industry are to decrease size while increasing device speed, capability and interconnection density. A high interconnection density requires multilayer printed circuit boards having two or more layers of interconnections. Typically, there are four to eight layers, as specified, for example, by the Personal Computer Memory Card International Association (PCMCIA) manufacturing guidelines and tending to steadily rise.

Increased signal speed creates a greater need for component and circuitry impedance matching. Current technological developments require less distortion in signal propagation and a need for controlled impedance for impedance matching. High signal propagation speed requires a lower insulator dielectric constant. Reduced cross-talk requires reduced dielectric thickness, and cost and waste must be minimized.

Current state of the art multilayer printed circuit boards consist of two or more layers of patterned conductive sheets separated by an insulating material consisting of a glass fiber reinforced resin. Interconnections between different layers are provided using via holes through the insulating material plated with metal. Via holes may be through holes, blind vias or buried vias. Through holes pass through the entire thickness of the printed circuit board. Blind vias and buried vias pass through only part of the board, with the blind vias having an end exposed, and the buried vias having neither one of the ends exposed.

Multilayer PC boards are produced by laminating cores, prepreg and optionally carrier-mounted copper foil. Prepregs are sheets of glass fiber reinforced resin which is dried but not cured. This material is called "B" stage. Cores are fully cured ("C" stage) fiber reinforced resin (core material) covered with copper foil, usually on both sides. "A" stage is the resin compound in a liquid form with its solvent carrier.

After patterning the copper on the "inner layers" and subjecting them to an oxide process as known in the art, the cores are stacked with prepreg inserted between them. The outermost components of the stack are cores (core cap) or carrier-mounted copper foil (foil cap). The stack is laminated using heat and pressure such that the resin in the prepreg is fully cured. Plated via holes may be provided for interlayer contact by mechanically, laser or plasma drilling through the laminated structure followed by copper plating. Blind vias may be provided by laser or plasma drilling partly through the structure followed by plating, or by laminating a subassembly, providing through-holes and then laminating an additional layer on one side followed by plating. Buried vias may be provided by producing a blind via and laminating additional layers on the exposed end of the hole or by providing a through hole and laminating additional layers on both sides. Between drilling and the additional laminating, the following steps are carried out. The through holes are electroless plated with copper, the exposed copper is patterned, and then additional copper is electroplated onto the traces.

Blind vias may be provided by laser/plasma drilling because the hole stops when reaching a copper layer. The laser/plasma drilling is uneven if the material is inhomogeneous. Blind vias cannot be produced directly by mechanical drilling.

Heat sinks may be attached to printed circuit boards by using an adhesive sheet with openings cut in the areas where components will be assembled.

Conventional PCB fabrication methods require 8 to 28 mils (thousandths of an inch) core material thickness to build 4 to 10 layers into a circuit board; 5 mil core material is employed for applications requiring more than 10 layers. Standard glass reinforced prepreg has a dielectric constant of 4.3–4.6 at 1 MHz and a glass transition temperature (Tg) of approximately 130C. Prepreg has a dielectric constant of 4.2 to 4.8 due to the combination of fiberglass dielectric constant of 6.3 and resin dielectric constant of 3.8. As discussed above, a reduced dielectric constant leads to an increased signal propagation velocity. For example, a 19% reduction in the dielectric constant results in a 11% rise of the signal propagation velocity.

To achieve a greater layer count in a multilayer board, the thickness of the prepreg material must be decreased to less than 5 mils. The minimum processing thickness of prepreg in production volumes is 3 to 5 mils. Thinner prepreg is more likely to provide insufficient resin during lamination. Processing material with a core thickness of less than 5 mils exceeds most current process and equipment designs and capabilities.

PCMCIA manufacturing guidelines specify a finished thickness of 30 mil maximum. Current conventional processes require 2 to 3 mil core material to achieve 6 to 8 layers with a thickness of less than 30 mil. Processing core material of less than 5 mil exceeds standard process capabilities in handling and transfer systems for conveyor driven processes. Upgrading to accommodate thinner material processing requires high capital investments.

Thinner PCB's require a single ply of prepreg (single fiberglass weave) for bonding inner layers. Suitable prepreg exceeds 2 mils thickness in a single ply and has a loose fiber weave. The result is overall mechanical weakness, poor dimensional stability and resin starvation.

Current restraints of laser and plasma drilling technology are the dissimilar resin and fiberglass properties (i.e. melting points). The complex process of material removal (vaporization) is uneven due to the dissimilar melting points.

A major factor inhibiting fine line technology is surface smoothness. Smoother surfaces permit straighter traces. On a flat surface, a higher trace resolution is achieved. Weave texture protrusion through Cu foil limits the achievement of finer traces.

Currently, patterned adhesive sheets are needed for heat sink attachment.

A recently developed technique for PCB fabrication is the Surface Laminar Circuit (SLC) technique. This technique produces a surface laminar layer built up on a copper-clad glass fiber reinforced epoxy sheet. The surface laminar layer is made of photosensitive epoxy dielectric layers and plated copper wiring layers. Interconnections between the wiring layers are provided by photo processed via holes made in the dielectric layer.

SUMMARY OF THE INVENTION

Accordingly, an object of the present invention is to provide printed circuit boards of reduced overall thickness and increased layer count without excessive reduction in the thickness of core material.

Another object of the present invention is to provide printed circuit boards with increased control of laser or plasma drilling.

A further object of the present invention is to provide a method for printed circuit board fabrication with reduced use of prepreg for cost reduction.

Yet another object of the present invention is to provide printed circuit boards with increased signal velocity.

Still another object of the present invention is to provide printed circuit boards with straighter traces and higher trace resolution.

The present invention is directed to a printed circuit board having a first component with a first flat surface and a second component with a second flat surface. An unreinforced, thermosetting, non-photosensitive resin layer is interposed between the first and second surfaces. If the first and second components are printed circuit board cores, the resin need not be non-photosensitive but use of non-photosensitive resin is still possible.

The method of the present invention includes providing at least a first component having a first surface and a second component having a second surface. The first surface is coated with a first layer of unreinforced thermosetting resin and the first layer is cured. A second layer is applied to either the first coated surface or to the second surface and dried. The components are then stacked such that the first and second layers are interposed between the first and second surfaces. Heat and pressure are then applied whereby the second layer is cured and binds the stacked components.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

DESCRIPTION OF THE PREFERRED EMBODIMENT

The present invention will be described in terms of the preferred embodiment. The preferred embodiment is a printed circuit board laminated without reinforced binder and method for its fabrication. Such a structure is shown in FIG. 1.

Figure 1:
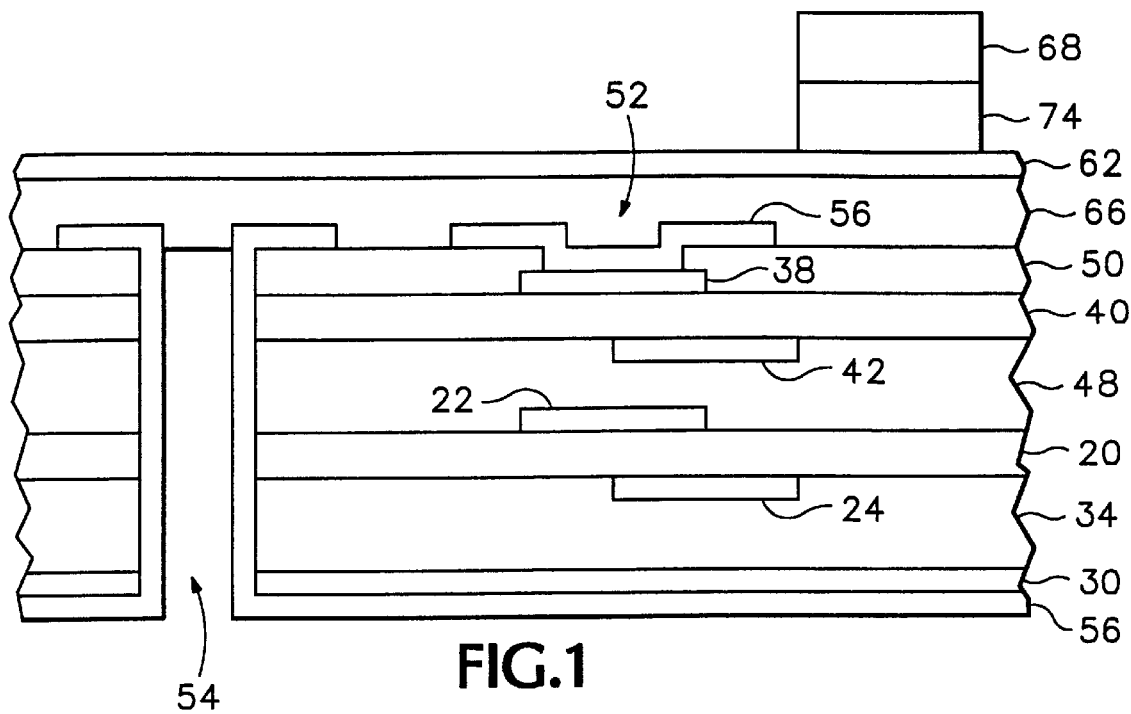
FIG. 1 is a cross-sectional view of a printed circuit board according to the present invention.

The structure of FIG. 1 includes unreinforced thermosetting resin layers 34, 48, 50, 66 and 74 which do not have to be photosensitive. The resin may have a glass transition temperature of about 120 to 270° C. and a dielectric constant of about 3.8 at 1 MHz. Layer 34 is interposed between copper foil 30 plated with copper layer 56 and fiber reinforced core material 20 carrying traces 22 and 24. Layer 48 is interposed between core material 20 and fiber reinforced core material 40 carrying traces 38 and 42. Layer 50 is interposed between core material 40 and the upper plane of plated copper layer 56. Layer 66 is interposed between upper plane of plated copper layer 56 and copper foil 62. Between a heat sink 68 and copper foil 62 is unreinforced resin layer 74.

The upper plane of plated copper layer 56 is connected to trace 38 through a buried via 52 in unreinforced resin layer 50. It is also connected to copper foil 30 through blind via 54. The thickness of the unreinforced resin layers may be between about 0.7 mils and 2.5 mils, more preferably between about 1.0 mil and 2.0 mils, and most preferably about 1.5 mils.

Figure 2:
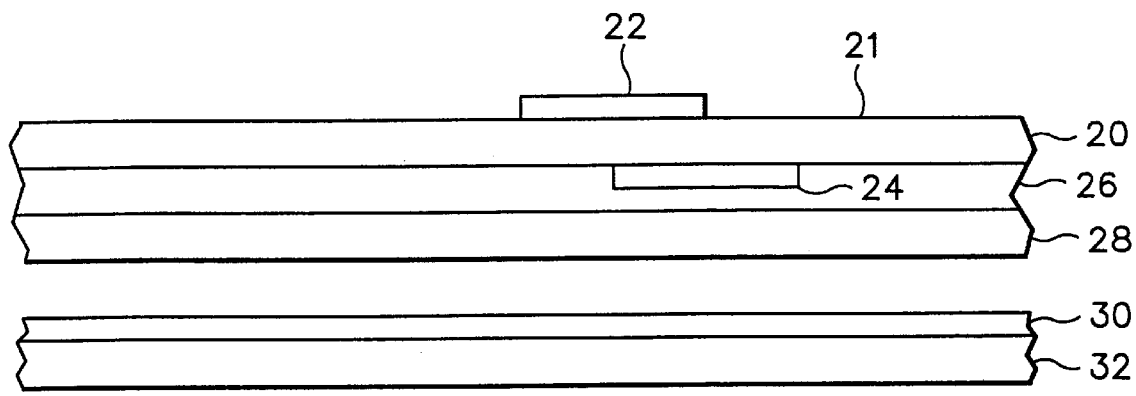
FIG. 2 is a cross-sectional view illustrating the binding of a copper foil to a core.

The fabrication of the board of FIG. 1 may begin, as shown in FIG. 2, with core 21 including core material 20 carrying patterned copper traces 22 and 24. Core 21 may be 5 mil core material, ½ oz. low profile Cu foil, HTE or non-HTE. Core 21 is coated with a layer of epoxy resin 26 which is fully cured (to C stage). Possible resin formulations will be given below. The coating may be done by screen printing as described below. The curing may be carried out for about 15 minutes at about 177° C. A second coating of resin 28 is then applied and dried but not cured to attain B stage. The drying may be carried out for about 5 minutes at a temperature of about 177° C. The coated core is then stacked onto copper foil 30 on carrier 32. Copper foil 30 may be ½ oz. foil.

Figure 3:
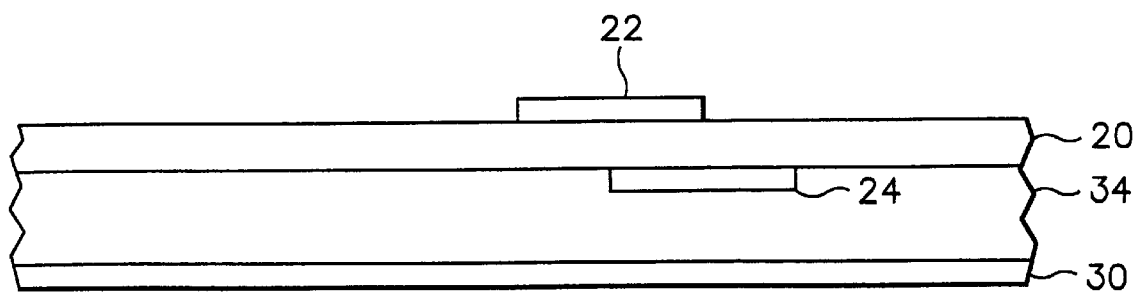
FIG. 3 is a cross-sectional view of the structure resulting from the step of FIG. 2.

The assembly is then laminated at a pressure of 50–100 psi, vacuum of 60 inches and a temperature of 181° C. with a heat rate of rise of 10–12° C. As a result, layer 28 bonds to foil 30 and cures to C stage. The resulting structure after removal of the carrier is shown in FIG. 3, where layers 26 and 28, now indistinguishable, are shown as layer 34. In this process, layer 26 served to prevent short circuits between trace 24 and foil 30, and layer 28 served to bind the core and the foil.

Figure 4:
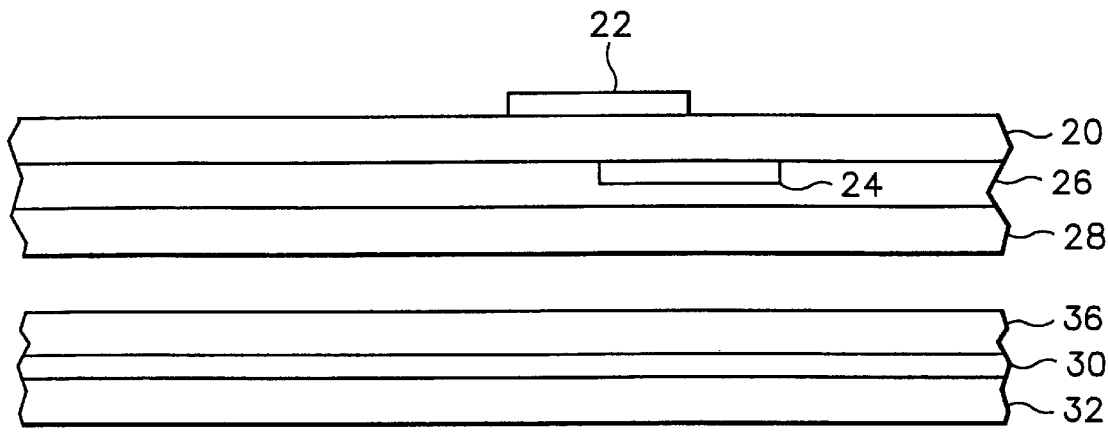
FIG. 4 is a cross-sectional view illustrating an alternate method for the binding of a copper foil to a core.

As shown in FIG. 4, foil 30 could have been coated with a fully cured resin layer 36 before the lamination. Foil 30 may be patterned (not shown) with straighter traces and higher trace resolution because it is smoother than the copper foils cladding fiber-reinforced resin cores.

Figure 5:
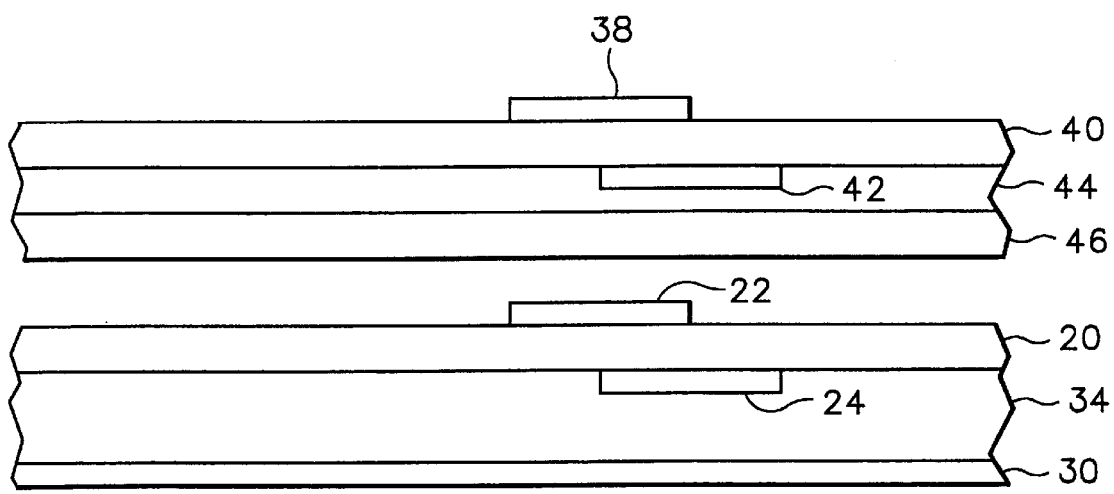
FIG. 5 is a cross-sectional view illustrating the binding of a core to the structure of FIG. 3.
Figure 6:
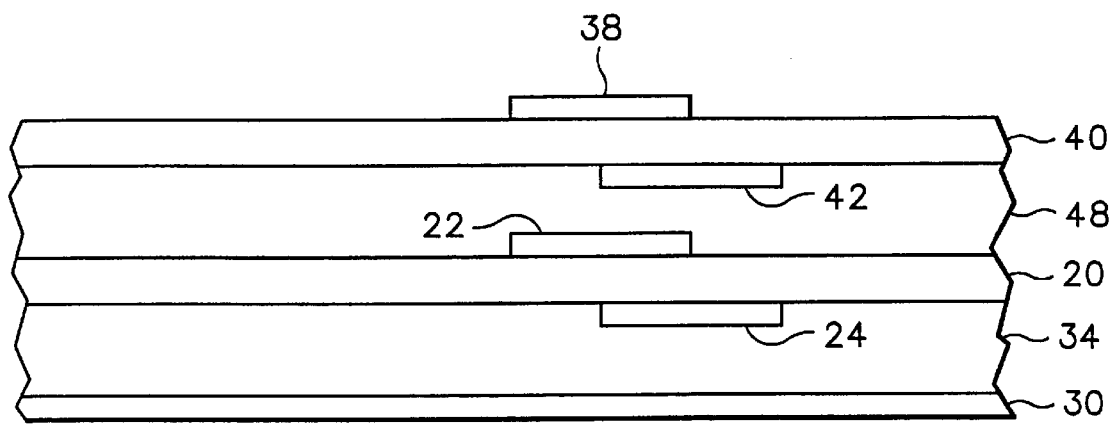
FIG. 6 is a cross-sectional view of the structure resulting from the step of FIG. 5.

A second core 40 carrying traces 38 and 42 may be laminated onto the resulting structure as shown in FIGS. 5 and 6 (or stacked before the lamination step described above and laminated in one step). As described above, a layer of resin 44 is applied onto core 40 and fully cured to C stage. Next, another layer of resin 46 is applied and dried but not cured to attain B stage. After lamination, layers 44 and 46 become indistinguishable and are shown as layer 48 in FIG. 6.

A resin layer 50 is then applied to the exposed surface of core 40 and trace 38, and fully cured. A through hole 54 is drilled using mechanical drilling, and a blind via hole 52 is drilled using laser or plasma drilling. For laser drilling, an RF control sealed $CO_2$ laser may be used, with a pulse duration of 90–110 milliseconds and power of 120–150 watts. The resulting structure is shown in FIG. 7.

Figure 7:
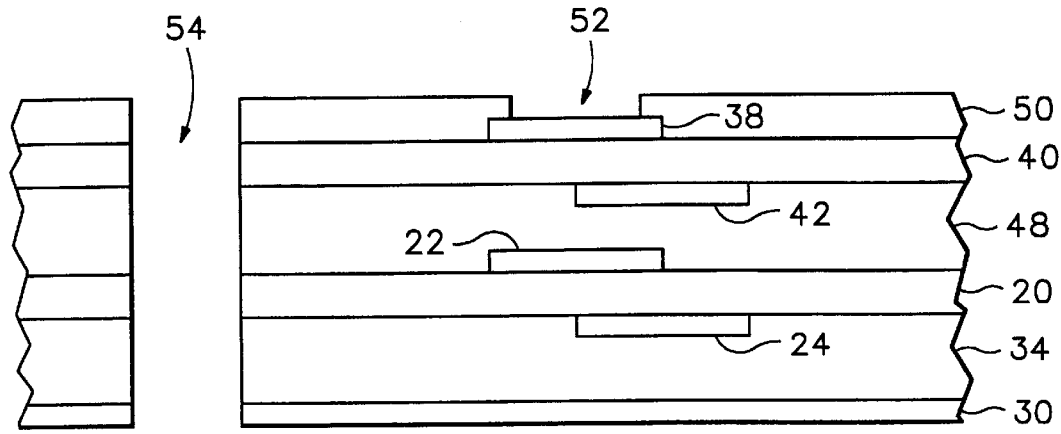
FIG. 7 is a cross-sectional view of the structure of FIG. 6 after the drilling of a through hole.
Figure 8:
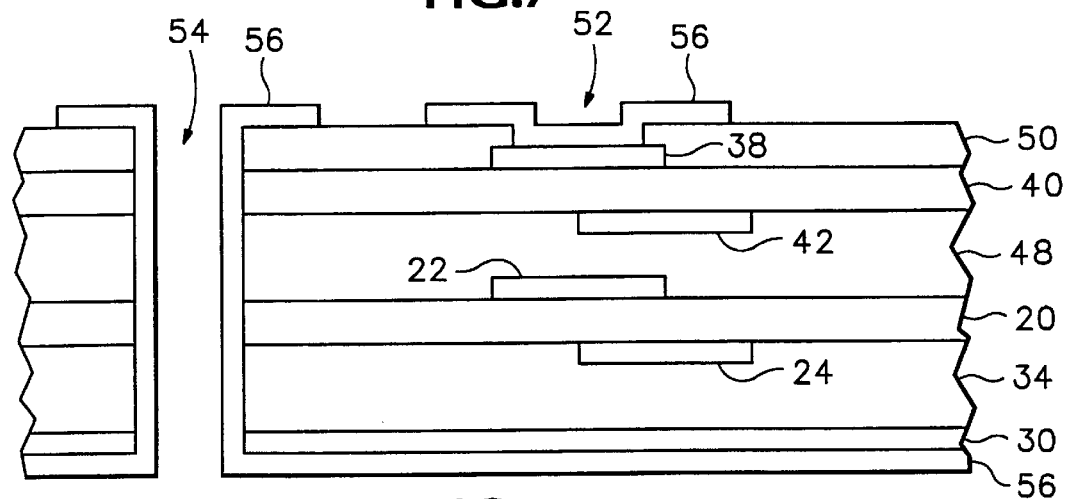
FIG. 8 is a cross-sectional view of the structure of FIG. 7 after the plating of the through hole.

In FIG. 8, the structure of FIG. 7 has been copper plated and the top surface of the copper plating 56 has been patterned using photolithography and etching as known in the art. The laser or plasma etched blind via 52 may be distinguished from mechanically drilled via 54 because it is closed by trace 38 and plated layer 56.

Figure 9:
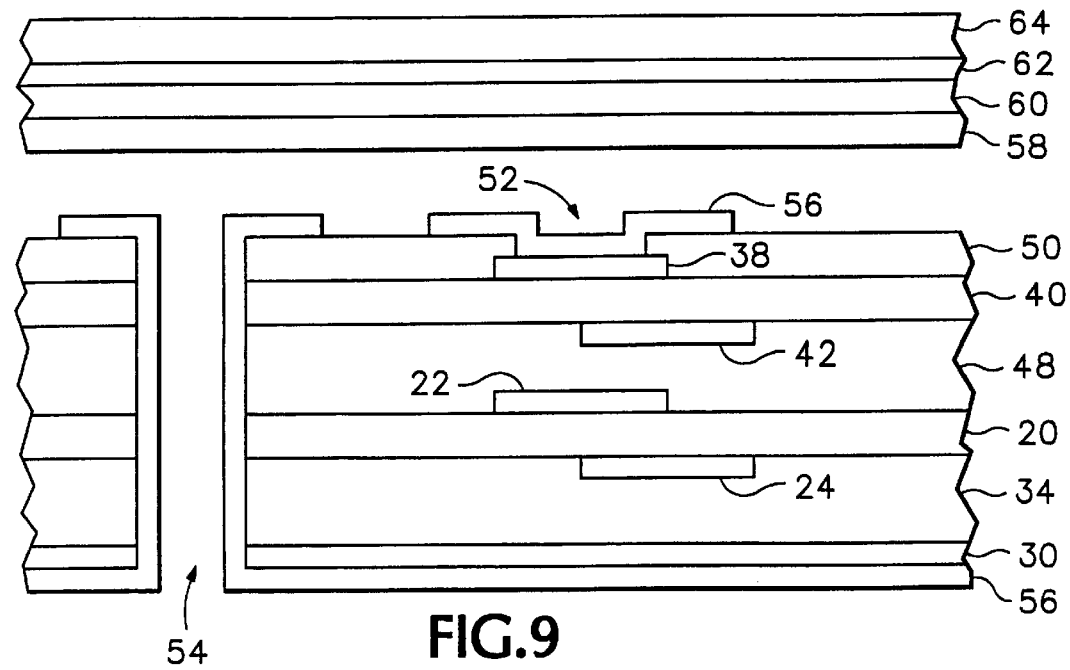
FIG. 9 is a cross-sectional view illustrating the binding of a foil cap to the structure of FIG. 8.
Figure 10:
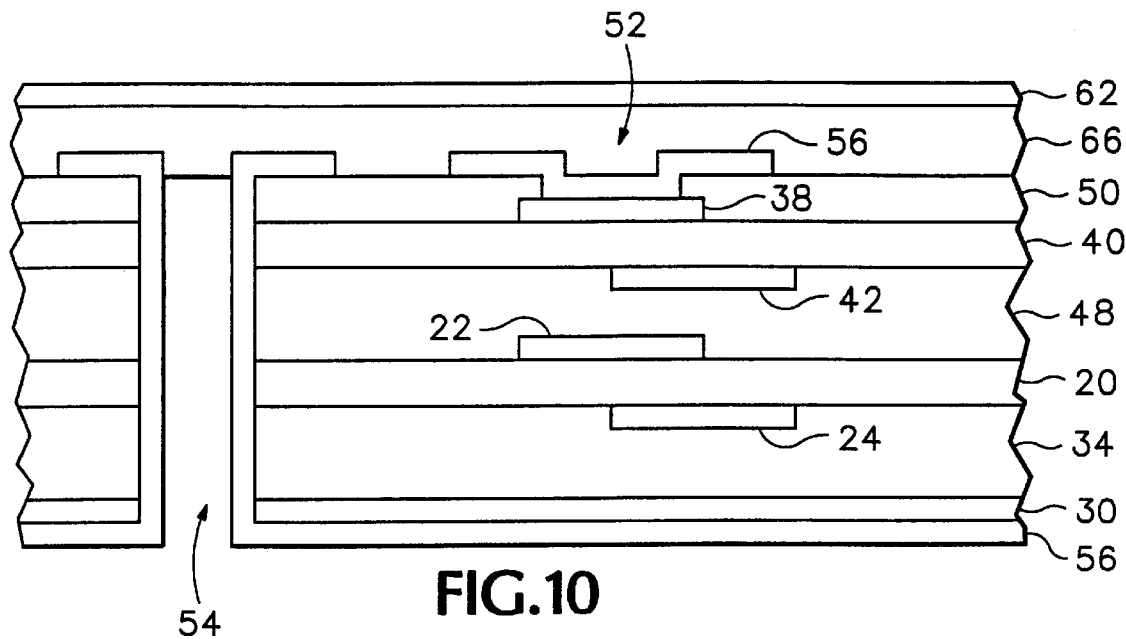
FIG. 10 is a cross-sectional view of the structure resulting from the step of FIG. 9.

FIGS. 9 and 10 illustrate the attachment of a foil cap 62 to the structure of FIG. 8. Copper foil 62 is carried by carrier 64 and coated with fully cured C stage resin layer 60 and dried B stage resin layer 58 (FIG. 9). After lamination, layers 58 and 60 become indistinguishable and are represented as layer 66 in FIG. 10. Foil 62 may be patterned (not shown) with straighter traces and higher trace resolution because it is smoother than the copper foils cladding fiber-reinforced resin cores.

Figure 11:
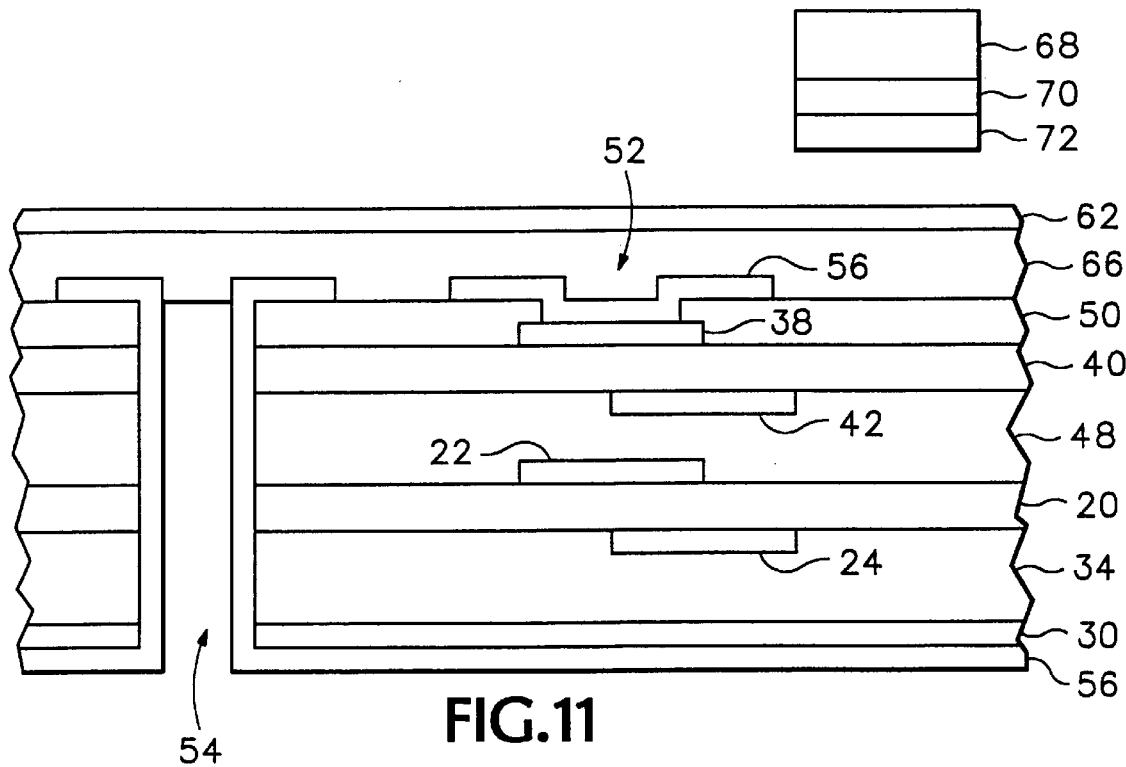
FIG. 11 is a cross-sectional view illustrating the binding of a heat sink to the structure of FIG. 10 to obtain the structure of FIG. 1.

FIGS. 11 and 1 illustrate the attachment of a heat sink 68 to the structure of FIG. 10. Heat sink 68 is coated with fully cured C stage resin layer 70 and dried B stage resin layer 72 (FIG. 11). After lamination, layers 70 and 72 become indistinguishable and are represented as layer 74 in FIG. 1.

Two possible resin compositions that can be used to practice the present invention are given below. The first composition consists of 50–70% Shell™ compound 1206R-55 and the remainder Shell™ compound 183. The first compound is mixed into the second slowly, with vigorous mixing to ensure uniformity. Heating the mixture between 35–40° C. taking care not to exceed 90° C. will help dissolve the resin. The viscosity of the mixture is about 28,000±5000 cps. The mixture must be kept covered and used within 24 hours. Pot life is approximately 2.5 days before viscosity starts to change.

The second composition consists of 20–30% Shell™ compound 1206R-55 and the remainder Shell™ compound 1151. The first compound is mixed into the second slowly, with vigorous mixing to ensure uniformity. The viscosity of the mixture is about 7000 to 8000 cps. The mixture must be kept covered and used within 24 hours. Pot life is approximately 3 days before viscosity starts to change.

Screen printing of the resin layers may be done using a mesh of 91-110T monofilament polyester. The stencil material may be Red TI or Indirect films available from Ulano™. For hand printing, screen tension may be about 23–27 $N/cm^2$, with an optimum of about 25 $N/cm^2$, squeegee hardness may be about 70 durometer and off contact may be about 3/16". For automatic printing, the screen tension may be about 25 $N/cm^2$±2 $N/cm^2$, squeegee hardness may be about 70 durometer, off contact may be ½" and pressure may be 90 psi on the front side and 100 psi on the rear side.

In summary, a printed circuit board laminated without reinforced binder and a method for its fabrication have been described.

The present invention has been described in terms of a preferred embodiment. The invention, however, is not limited to the embodiment depicted and described. Rather, the scope of the invention is defined by the appended claims.

What is claimed is:

1. A printed circuit board assembly comprising:
   a first printed circuit board having a first surface;
   a first cured, unreinforced resin layer covering a portion of the first surface;
   a first dried, uncured, unreinforced resin layer coating the first cured, unreinforced resin layer;
   a first component having a second surface; and
   a second dried, uncured, unreinforced resin layer contacting the second surface and the first dried, uncured, unreinforced resin layer.

2. A printed circuit board according to claim 1 wherein the first component comprises a metallic foil.

3. A printed circuit board according to claim 2 wherein the metallic foil comprises a copper foil.

4. A printed circuit board according to claim 1 wherein the first component comprises a second printed circuit board core.

* * * * *